United States Patent
Dubost et al.

(10) Patent No.: US 9,742,155 B2
(45) Date of Patent: Aug. 22, 2017

(54) MODULAR LASER APPARATUS

(71) Applicant: SAINT-GOBAIN GLASS FRANCE, Courbevoie (FR)

(72) Inventors: Brice Dubost, Courbevoie (FR); Emmanuel Mimoun, Boulogne-Billancourt (FR); Jean-Philippe Schweitzer, Chamant (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/026,684

(22) PCT Filed: Oct. 13, 2014

(86) PCT No.: PCT/FR2014/052600
§ 371 (c)(1),
(2) Date: Apr. 1, 2016

(87) PCT Pub. No.: WO2015/055932
PCT Pub. Date: Apr. 23, 2015

(65) Prior Publication Data
US 2016/0241001 A1  Aug. 18, 2016

(30) Foreign Application Priority Data
Oct. 18, 2013 (FR) ..................... 13 60143

(51) Int. Cl.
*G02B 27/10* (2006.01)
*H01S 5/40* (2006.01)
(Continued)

(52) U.S. Cl.
CPC ........ *H01S 5/4012* (2013.01); *B23K 26/0066* (2013.01); *B23K 26/043* (2013.01);
(Continued)

(58) Field of Classification Search
CPC ................ G02B 5/045; G02B 19/0052; G02B 19/0057; G02B 27/0905; G02B 27/0977;
(Continued)

(56) References Cited

U.S. PATENT DOCUMENTS 5,155,623 A  10/1992  Miller et al.
6,356,577 B1  3/2002  Miller
(Continued)

FOREIGN PATENT DOCUMENTS

CN  101 854 031 A  10/2010
DE  10 2008 063006 A1  6/2010
(Continued)

OTHER PUBLICATIONS

International Search Report Issued Dec. 8, 2014 in PCT/FR14/52600 Filed Oct. 13, 2014.

*Primary Examiner* — Loha Ben
(74) *Attorney, Agent, or Firm* — Oblon, McClelland, Maier & Neustadt, L.L.P.

(57) ABSTRACT

A laser apparatus includes a plurality of laser modules each generating a laser line in a working plane. The laser modules are juxtaposed so that the laser lines generated by the modules combine into a single laser line. Each of the laser modules includes at least one laser line generator. The laser line generator includes two linear arrays of strips of laser diodes each emitting a focused laser beam. The two linear arrays are arranged parallel to each other so that the strips are staggered. The two sets of parallel laser beams generated by the two linear arrays of strips, respectively, are merged into a single laser line by a set of mirrors. The linear arrays of strips of laser diodes and the mirrors are arranged so that the two sets of laser beams trace optical paths of the same length before being merged into a single laser line.

15 Claims, 2 Drawing Sheets

Figure 1:
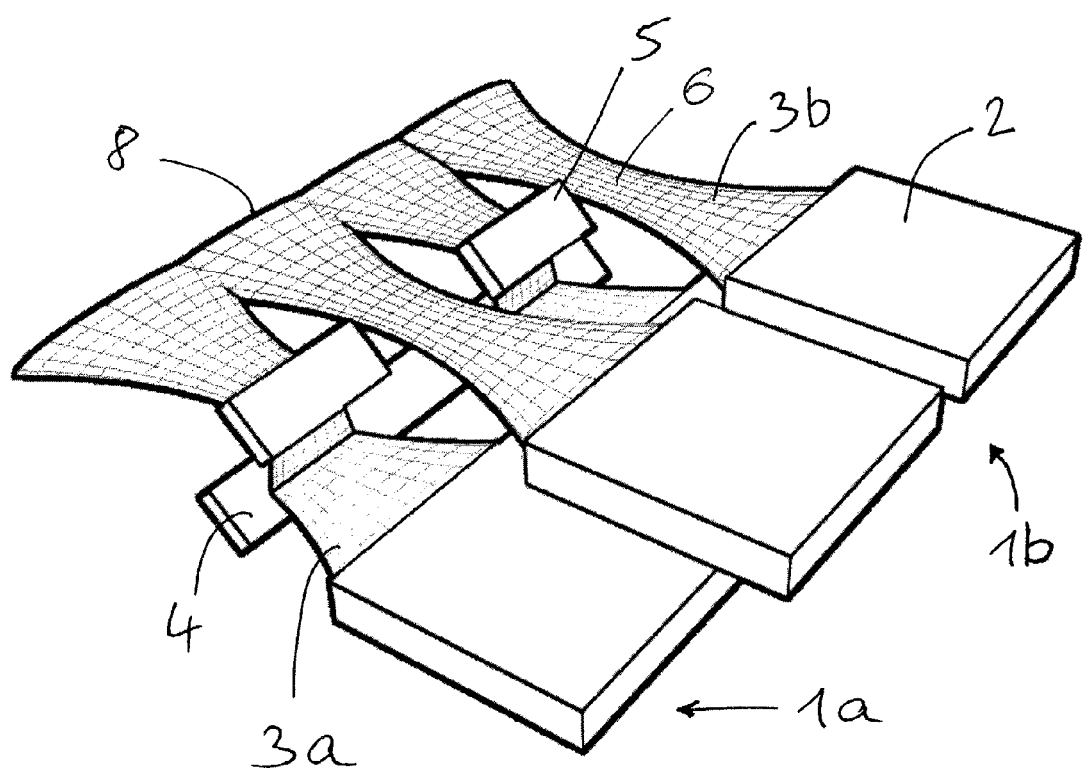

(51) Int. Cl.

| | | |
|---|---|---|
| *G02B 27/09* | (2006.01) | |
| *F21V 7/00* | (2006.01) | |
| *B23K 26/00* | (2014.01) | |
| *B23K 26/06* | (2014.01) | |
| *G02B 19/00* | (2006.01) | |
| *G02B 27/14* | (2006.01) | |
| *B23K 26/073* | (2006.01) | |
| *C21D 9/50* | (2006.01) | |
| *C21D 1/38* | (2006.01) | |
| *B23K 26/04* | (2014.01) | |

(52) U.S. Cl.
CPC ...... *B23K 26/0608* (2013.01); *B23K 26/0643* (2013.01); *B23K 26/0738* (2013.01); *C21D 1/38* (2013.01); *C21D 9/50* (2013.01); *F21V 7/0083* (2013.01); *G02B 19/0057* (2013.01); *G02B 27/0905* (2013.01); *G02B 27/0977* (2013.01); *G02B 27/1006* (2013.01); *G02B 27/143* (2013.01); *H01S 5/405* (2013.01); *H01S 5/4043* (2013.01); *H01S 2301/20* (2013.01)

(58) Field of Classification Search
CPC .. G02B 27/10; G02B 27/1006; G02B 27/095; G02B 27/106; G02B 27/143; H01S 5/4012; H01S 5/4025; H01S 5/4043; H01S 5/405; H01S 5/42; F21V 7/0083; B23K 26/042; B23K 26/043; B23K 26/0604; B23K 26/0608; B23K 26/064; B23K 26/0643; B23K 26/0732; B23K 26/0736; B23K 26/0738
USPC ............ 359/618, 485.01; 362/227, 228, 247, 362/230, 231, 234–236, 249.01, 249.02; 353/8, 31, 33; 372/9
See application file for complete search history.

(56) References Cited

U.S. PATENT DOCUMENTS

| | | | |
|---|---|---|---|
| 7,768,708 | B1 | 8/2010 | Harris et al. |
| 8,215,776 | B2 * | 7/2012 | Kessler ............ G02B 27/0905 353/31 |
| 8,465,155 | B2 * | 6/2013 | Kessler ............ G02B 27/0905 353/33 |
| 8,842,369 | B2 * | 9/2014 | Li ..................... G02B 27/141 359/634 |
| 8,967,826 | B2 * | 3/2015 | Mikhailov ......... B23K 26/0608 362/236 |
| 2012/0081893 | A1 * | 4/2012 | Faybishenko ....... G02B 6/4296 362/235 |
| 2013/0182435 | A1 | 7/2013 | Mikhailov |

FOREIGN PATENT DOCUMENTS

| | | |
|---|---|---|
| WO | 01/06297 A2 | 1/2001 |
| WO | 2012/032116 A1 | 3/2012 |

\* cited by examiner

MODULAR LASER APPARATUS

BACKGROUND OF THE INVENTION

The present invention relates to an apparatus for laser annealing large-width substrates, said apparatus being formed from a plurality of juxtaposable laser modules, without particular limitation.

It is known to carry out local rapid laser annealing (laser flash heating) of coatings deposited on flat substrates. To do this, the substrate with the coating to be annealed is run under a laser line, or else a laser line is run over the substrate bearing the coating.

Laser annealing allows thin coatings to be heated to high temperatures, of about several hundred degrees, while preserving the underlying substrate. Run speeds are of course preferably as high as possible, advantageously at least several meters per minute.

The present invention in particular relates to lasers using laser diodes. The latter are currently the best laser sources from the point of view of price and power.

In order to obtain the powers per unit length required to implement a process with a high run speed, it is desirable to concentrate the radiation of a very large number of laser diodes into a single laser line. At the substrate bearing the coating to be annealed, the power density of this laser line must generally be as uniform as possible, so as to expose all the points of the substrate to the same annealing energy.

However, the large number of laser diodes required to obtain a sufficient power per unit length, about 50 W/mm, creates a problem with spatial bulk.

It has been estimated that if commercially available strips of laser diodes were juxtaposed parallel to the main axis of the laser line (horizontal stacking), the length of the linear array of strips would be about twice as large as the length of the final laser line generated.

This spatial bulk—which could be considered to be acceptable for small lines, of about a few tens of centimeters in length—is not acceptable for lines of a few meters in length. However, it would be desirable to be able to treat, at high speed, substrates of large width, such as the "jumbo" size (6 m×3.21 m) flat glass sheets produced by float processes.

Moreover, the aforementioned problem with spatial bulk prevents modular design of the optical system of a laser apparatus. Specifically, it will be readily understood that, in order to be able to combine a plurality of short elementary laser lines into a single longer laser line, each individual laser module must have lateral dimensions smaller than or equal to the length of the elementary line that it generates. If these lateral dimensions were larger, the juxtaposition of the modules would result in a discontinuous final line.

Another approach for increasing the power of diode lasers consists in juxtaposing strips of diodes one on top of another (vertical stacking) and in merging the beams generated by these stacks of strips by means of a focusing lens. However, the quality of the laser line obtained in this way is unsatisfactory for the intended applications of the present invention as in these applications it is important to preserve, in the working plane (substrate), a depth of field of ±1 mm for the laser line, i.e. a line the width of which does not vary more than 10% over ±1 mm.

The present invention provides laser modules using, as a light source, strips of laser diodes, making it possible to generate laser lines having a length longer than or equal to the dimension of the module in the direction parallel to the laser line generated by said module. Moreover, the proposed laser modules do not have the drawbacks of the vertically stacked diode lasers of the prior art, and form laser lines having a satisfactory quality and a sufficiently high depth of field to accommodate common glass substrate planarity defects, conveying effects, system vibrations, etc. which are generally of the order of one millimeter.

In order to form the laser apparatus of the present invention, a plurality of laser modules are aligned next to one another so that the elementary laser lines that they generate combine into a single laser line having a uniform power density over a large length. The spatial bulk of the laser apparatus in the direction parallel to the main axis of the laser line is not substantially greater than the length of the line.

The present invention is based on the idea of superposing two linear arrays of strips of diodes, preferably substantially parallel to each other, and then merging the two parallel sets of laser beams into a single laser line by means of a set of mirrors described in greater detail below. The ingenious system of mirrors used to merge the beams emitted by the two superposed linear arrays of strips allows known drawbacks resulting from the vertical stacking of laser diodes of the prior art, i.e. the loss of quality of the laser line obtained, to be avoided.

The subject of the present invention is a laser apparatus comprising a plurality of laser modules each generating a laser line in a working plane, said laser modules being juxtaposed and aligned along their length so that the laser lines generated by the modules combine into a single laser line, each of the laser modules comprising at least one means for generating a laser line, said laser apparatus being characterized in that the or each means for generating a laser line comprises two linear arrays of strips of laser diodes, in which the strips are aligned along their length, each emitting a focused laser beam, the two linear arrays being arranged parallel to each other so that the strips are staggered, the two sets of parallel laser beams generated by the two linear arrays of strips, respectively, being merged into a single laser line by means of a set of mirrors, the linear arrays of strips of laser diodes and the mirrors being arranged so that all the laser beams, i.e. the two sets of laser beams, trace optical paths of the same length before being merged into a single laser line.

The two linear arrays of strips of diodes superposed in each means for generating a laser line may be perfectly identical to each other, i.e. comprise the same number of strips, or else one of the two linear arrays may comprise one strip more than the other. The strips of the two linear arrays are advantageously identical (same power, wavelength, size etc.). In each linear array, the strips are preferably juxtaposed with a minimum space between them.

Each linear array of strips of diodes therefore has a periodicity with a period that is larger than or equal to the size of a strip.

As already indicated above, the two linear arrays are arranged parallel to each other so that the strips are staggered, in other words the two linear arrays are offset by a half-period so that each strip of a linear array is an exactly equal distance away from the closest strips of the other linear array.

Each linear array of strips emits as many beams as the linear array comprises strips. The two sets of beams emitted by the two linear arrays, respectively, are parallel to each other and reproduce the staggered lateral offset of the strips.

It will be understood below, on reading the detailed description of the set of mirrors used, that this offset of a half period is indispensable for the unification of the two sets of beams into a single laser line.

In the present invention, it is essential for the two sets of laser beams emitted by the two linear arrays of strips to have traced optical paths of the same length before being merged into a single monochromatic laser line. If this were not the case, the two sets of beams would not be the same size and/or would not have the same divergence, and the quality of the laser line resulting from their unification would be unsatisfactory.

In the detailed description below of a means for generating a laser line, the set of laser beams reflected by a segmented mirror will be referred to as the "first set of laser beams", and the set the beams of which pass through intervals between the segments of the segmented mirror will be referred to as the "second set of laser beams" or the "other set of laser beams". This second/other set of beams is not reflected by a mirror (first embodiment, shown in FIG. 1), or else is reflected by a mirror that may be continuous (second embodiment, shown in FIG. 2) but also segmented.

Therefore, in a first embodiment of the present invention, only one of the two sets of laser beams—called the "first set of laser beams" below—is redirected and guided by a set of mirrors into the plane of the second set of laser beams. This change in direction increases the length of the optical path of this first set of laser beams. In order to compensate for the increased length of the optical path of the first set of laser beams, resulting from the redirection by the mirrors, the linear array of strips of laser diodes that emits the first set of laser beams is shifted—in the propagation direction of the second laser beam—by a distance equal to the increase in the length of the optical path due to the redirection by the set of mirrors.

The redirection of the first set of beams is advantageously achieved via two successive reflections:
    a first reflection that modifies the plane of propagation of the first set of beams so that it cuts the plane of propagation of the second set of beams; and
    a second reflection, level with the intersection of the two planes of propagation, leading to the overlap of the two propagation planes and to the formation of a single "sheet" or line of laser radiation.

The geometry of this double reflection leading the two sets of beams to merge is shown in FIG. 1.

In one particular embodiment of the present invention, these two successive reflections make right angles, i.e. the first set of laser beams undergoes two orthogonal reflections. The length of the optical path of the first set of laser beams is then increased by the initial distance between the two propagation planes. In order to compensate for this length increase, the linear array of strips of laser diodes emitting the first set of laser beams is advanced—i.e. shifted in the direction of propagation of the second set of beams—by a distance equal to the initial distance between the two propagation planes of the two sets of beams.

Of course, the double orthogonal reflection is only one particular embodiment, and it is entirely envisionable to position the mirrors so as to obtain two non-orthogonal reflections. Those skilled in the art will be able, via a simple trigonometric calculation, to calculate how far the first linear array of strips of diodes must be shifted to compensate for the corresponding length increase of the optical path.

In a preferred embodiment of the present invention, the first reflection of the first set of laser beams in the direction of the plane of the second set of laser beams is achieved by means of a single mirror, called the continuous mirror below. Although this single continuous mirror may be replaced by a number of mirrors placed in a given plane, this would make this portion of the apparatus needlessly complex and it is therefore undesirable to use a segmented mirror to carry out the first reflection of the first set of beams.

The situation is very different in the case of the second reflection. The latter occurs level with the line of intersection of the two propagation planes and it is impossible to use a single continuous mirror as this would inhibit the propagation of the second set of laser beams. A segmented mirror consisting of at least as many mirror segments as the first set of laser beams comprises laser beams is therefore used for the second reflection, each beam of the first set of laser beams being reflected by one mirror segment. The use of a segmented mirror takes advantage of the lateral offset, of a half period, of the two linear arrays of strips of diodes. Specifically, by virtue of this offset the beams of the first set of beams alternate with those of the second set of beams, and a mirror segment of appropriate size may reflect the beams of the first set without intercepting those of the second set.

After this second reflection, the first set of laser beams propagates in the propagation plane of the second set of laser beams, the two sets forming a single monochromatic laser line.

The set of mirrors used in the present invention therefore preferably comprises:
    a continuous first mirror reflecting the first set of laser beams in the direction of the plane of the second set of laser beams; and
    a segmented second mirror consisting of at least as many mirror segments as the first set of laser beams comprises laser beams, each beam of the first set of laser beams being reflected by one mirror segment.

Figure 2:
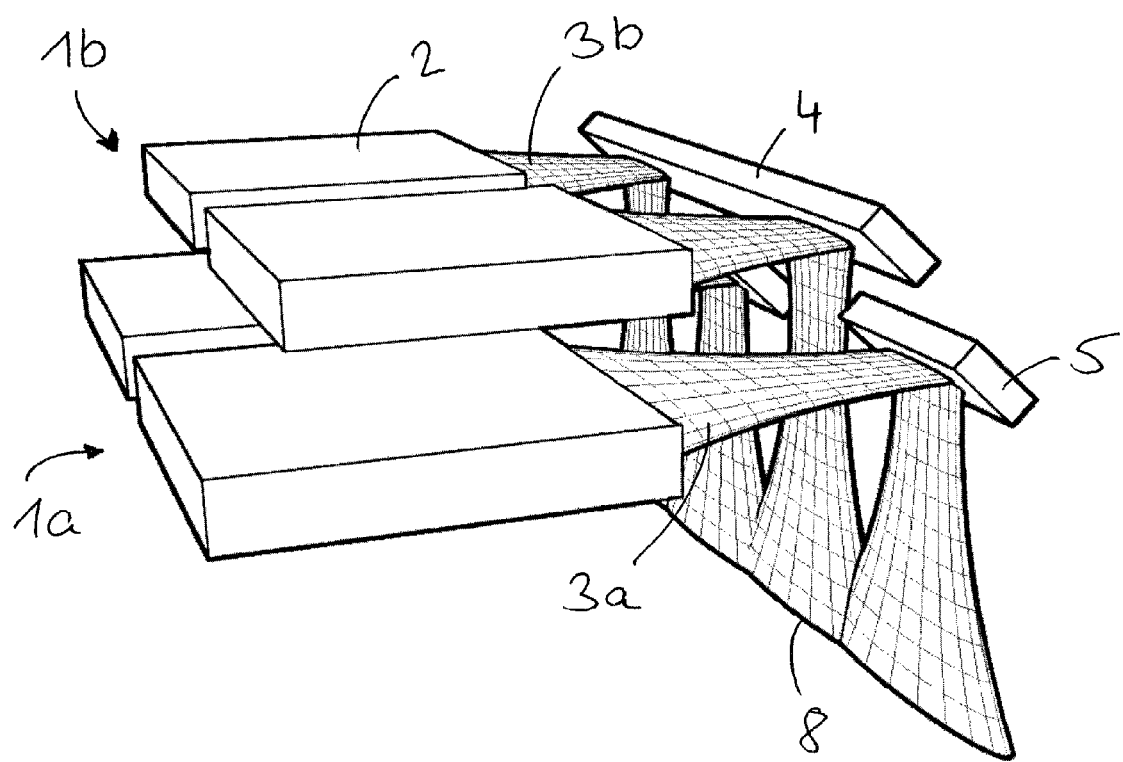

In a second embodiment of the modular laser apparatus of the present invention, shown in FIG. 2, the first and second sets of beams are each reflected by a mirror.

The two sets of beams are reflected by the same angle so that, after this reflection, the two propagation planes of the two sets of laser beams coincide and form a single laser line. The first set of laser beams is reflected by a segmented mirror that both allows the beams of the first set to be reflected and the beams of the other set to pass through intervals between the mirror segments. The other set of beams is preferably reflected by a continuous mirror.

The laser beams generated by each of the strips of laser diodes are beams that are focused by virtue of a focusing lens on exiting the strip.

In one particularly advantageous embodiment of the laser apparatus of the present invention, the segments of the segmented mirror are positioned so as to reflect the laser beams of the first set at their focal point. This positioning of the mirror segments at the focal point of the first beams is advantageous because it makes it possible to limit the area of these mirror segments as much as possible and thus to prevent them from blocking the passage of the beams of the second set of beams.

Each means for generating a laser light such as described above forms a monochromatic laser line having a given linear polarization state. Specifically, all of the laser diodes of the two linear arrays of strips of diodes produce laser radiation at the same wavelength and with the same polarization state. The double reflection does not modify the linear polarization state of the laser radiation.

It is known to increase the power of a laser diode apparatus by combining a plurality of beams or laser lines of different wavelengths or different polarization states by virtue of an optical system referred to in the present application as a "means for combining laser lines". Such an optical system is for example described in patent application US 2011/0176219.

It allows, by virtue of a set of polarization couplers and dichroic mirrors, laser beams generated separately by separate strips of laser diodes to be combined. Typically a plurality of strips or sets of strips of diodes generate a plurality of beams of different wavelengths, respectively, the beams of given wavelength possibly furthermore having two different polarizations that are orthogonal to each other.

In a preferred embodiment, the laser apparatus of the present invention therefore comprises at least two means for generating a laser line, each means generating a monochromatic laser line that differs from the one or more other monochromatic laser lines by its wavelength and/or by its polarization state. It for example comprises four pairs of means for generating a laser line, each pair generating two monochromatic laser lines having the same wavelength and that differ from each other by their polarization state. The various laser lines thus generated, eight in number in the aforementioned example, are then merged in the known way by a means for combining laser lines into a single polychromatic and/or dual-polarization laser line. The expression "dual-polarization" here describes a line or a mixture of laser beams polarized in two planes that are perpendicular to each other.

The modular laser apparatus of the present invention preferably comprises at least 5 modules, in particular at least 10 modules.

In order to form the laser apparatus of the present invention, a plurality of laser modules are aligned next to one another so that the elementary laser lines that they generate combine into a single laser line having a uniform power density over a large length.

More particularly, the laser modules are juxtaposed so that the laser lines generated by the modules combine into a single laser line having a total length preferably longer than 1.2 m, in particular longer than 2 m and ideally longer than 3 m.

With a view to laser treatment of "jumbo" substrates having a width of 3.21 m, the central portion of the laser line where the power density is substantially constant preferably has a length comprised between 3.20 and 3.22 m.

The laser modules are assembled and mounted on the laser apparatus so that the laser lines generated cut the substrate, or working plane, preferably at a small angle, typically smaller than 20° and preferably smaller than 10° relative to the normal to the substrate. The apparatus may be designed so that the laser modules remain stationary, the substrate to be treated running under or over the linear array of modules, generally in a direction perpendicular to the main axis of the laser line. As a variant, the apparatus may be designed so that the substrate remains stationary and the linear array of laser modules runs above or below the substrate while projecting the laser line thereon, preferably at a right angle.

BRIEF DESRIPTION OF THE DRAWINGS

The modular laser apparatus of the present invention will now be described in greater detail with reference to the appended figures, in which:

FIG. 1 is a perspective view of a first embodiment of a means for generating a laser line; and FIG. 2 is a perspective view of a second embodiment of a means for generating a laser line.

DETAILED DESCRIPTION OF EXAMPLE EMBODIMENTS

FIG. 1 shows two linear arrays 1a, 1b of strips of laser diodes. The linear arrays 1a, 1b are arranged on top of each other with a lateral shift such that the strips 2 are positioned staggered relative to one another. Each of the strips 2 generates a focused laser beam 3a, 3b. For the sake of simplicity, each of the linear arrays 1a, 1b here comprises only two strips. When the linear arrays comprise more than two strips, the latter are regularly spaced, each linear array of strips thus emitting a set of regularly spaced laser beams. The first set of beams 3a generated by the strips 2 of the bottom linear array 1a undergoes two successive orthogonal reflections: a first upward reflection ensured by a continuous mirror 4, then a second reflection ensured by a series of mirror segments 5, also referred to as a segmented mirror. The beams 3b of the top linear array 1b of strips of laser diodes are not reflected.

The segments of the segmented mirror 5 cut the propagation plane of the second set of beams 3b and are positioned in the intervals between the beams of the second set of beams 3b, more particularly near focal points 6 of the latter where the intervals between beams are maximal. The staggered arrangement of the strips 2 of the two linear arrays 1a, 1b means that, in this position, the mirrors 5 intercept and reflect the beams of the first set of beams 3a emitted by the bottom linear array 1a of strips of diodes.

These beams are focused so as to be reflected by the mirror segments 5 at their focal point.

The focus of the two sets of beams 3a, 3b is therefore set so that all the focal points are aligned on a given straight line, which is essentially superposed on the straight line defined by the second orthogonal reflection of the first set of laser beams 3a.

After the second orthogonal reflection of the first set of laser beams 3a, the two sets of beams propagate in the same plane, thus forming a single laser line 8.

It is essential in the present invention for the two sets of laser beams 3a, 3b to trace optical paths having the same length before being merged in a single propagation plane.

This is why the bottom linear array 1a of strips is shifted forward relative to the top linear array, i.e. in the direction of propagation of the beams 3b of this top linear array 1b. This shift compensates for the increase in length of the optical path seen by the first set of beams due to its double reflection. In the present case, this increase in length is equal to the distance between the initial propagation planes, in other words to the distance between the two reflections undergone by the first set of beams.

In the second embodiment shown in FIG. 2, the two sets of beams 3a, 3b generated by the two linear arrays 1a, 1b of strips are each reflected a single time.

The first linear array 1a and the second linear array 1b, located above the first, each comprise two strips 2. The first set of beams 3a generated by the first linear array 1a is reflected at right angles by a segmented mirror 5 positioned at the focal point of the beams, each mirror segment 5 reflecting one beam 3a.

The second set of beams 3b emitted by the second linear array 1b of strips first propagates parallel to the first set of beams 3a, then, when its propagation plane cuts the second propagation plane of the first set of beams 1a, the second set of beams undergoes an identical reflection to that of the first set of beams, which causes the propagation planes of the two sets of beams to superpose.

The focuses of the first and second sets of beams are identical and the second linear array 1b of strips is positioned so that the focal points of all the beams 3a, 3b are aligned level with the segmented mirror 5. The mirror 4 reflecting the second set of beams 3b is a continuous mirror.

The invention claimed is:

1. A laser apparatus comprising:
    a plurality of laser modules each generating a laser line in a working plane, said laser modules being juxtaposed and aligned along their length so that the laser lines generated by the modules combine into a single laser line,
    wherein each of the laser modules comprises two linear arrays of strips of laser diodes, in which the strips are aligned along their length, each emitting a focused laser beam, the two linear arrays being arranged parallel to each other so that the strips are staggered, two sets of parallel laser beams generated by the two linear arrays of strips, respectively, being merged into the single laser line through a set of mirrors, the linear arrays of strips of laser diodes and the mirrors being arranged so that the two sets of laser beams trace optical paths of the same length before being merged into the single laser line.

2. The laser apparatus as claimed in claim 1, wherein a single set of the two sets of laser beams, called a first set of laser beams, is redirected and guided by the set of mirrors into a plane of a second set of the two sets of laser beams, a linear array of the two linear arrays of strips of laser diodes emitting the first set of laser beams being shifted, in a propagation direction of the second set of laser beams, by a distance equal to an increase in length of the optical path due to redirection by the set of mirrors.

3. The laser apparatus as claimed in claim 2, wherein the first set of laser beams undergoes two orthogonal reflections and the linear array of strips of laser diodes is shifted by a distance equal to an initial distance between two propagation planes of the two sets of laser beams.

4. The laser apparatus as claimed in claim 2, wherein the set of mirrors comprises:
    a continuous mirror reflecting the first set of laser beams in a direction of the plane of the second set of laser beams; and
    a segmented mirror including at least as many mirror segments as the first set of laser beams comprises laser beams, each beam of the first set of laser beams being reflected by one mirror segment.

5. The laser apparatus as claimed in claim 4, wherein the segments of the segmented mirror are positioned so as to reflect the laser beams at a focal point of the laser beams.

6. The laser apparatus as claimed in claim 1, wherein the two sets of laser beams are reflected by the same angle so that, after reflection, two propagation planes of the two sets of laser beams coincide, a first set of the two sets of laser beams being reflected by a segmented mirror and a second set of the two sets of laser beams being reflected by a continuous mirror.

7. The laser apparatus as claimed in claim 6, wherein the segments of the segmented mirror are positioned so as to reflect the laser beams at a focal point of the laser beams.

8. The laser apparatus as claimed in claim 1, wherein the apparatus includes at least two mechanisms to generate a laser line, each mechanism generating a monochromatic laser line that differs from one or more other monochromatic laser lines by at least one of a wavelength and a polarization state.

9. The laser apparatus as claimed in claim 8, further comprising:
    a mechanism to combine laser lines allowing a plurality of laser lines to be merged into at least one of a single polychromatic laser line and a dual-polarization laser line.

10. The laser apparatus as claimed in claim 1, wherein the two linear arrays of strips of laser diodes comprise the same number of strips.

11. The laser apparatus as claimed in claim 1, wherein the plurality of laser modules includes at least 5 modules.

12. The laser apparatus as claimed in claim 1, wherein the plurality of laser modules includes at least 10 modules.

13. The laser apparatus as claimed in claim 1, wherein the single laser line has a total length longer than 1.2 m.

14. The laser apparatus as claimed in claim 1, wherein the single laser line has a total length longer than 2 m.

15. The laser apparatus as claimed in claim 1, wherein the single laser line has a total length longer than 3 m.

* * * * *